(12) United States Patent
Oakes et al.

(10) Patent No.: US 10,985,756 B2
(45) Date of Patent: Apr. 20, 2021

(54) THIN FILM DOOR SWITCH WITH INTEGRATED LIGHTING

(71) Applicant: GM GLOBAL TECHNOLOGY OPERATIONS LLC, Detroit, MI (US)

(72) Inventors: Jonathan L. Oakes, Sterling Heights, MI (US); Timothy J. Talty, Beverly Hills, MI (US); Andrew H. Leutheuser, Northville, MI (US); Donald K. Grimm, Utica, MI (US)

(73) Assignee: GM GLOBAL TECHNOLOGY OPERATIONS LLC, Detroit, MI (US)

( * ) Notice: Subject to any disclaimer, the term of this patent is extended or adjusted under 35 U.S.C. 154(b) by 395 days.

(21) Appl. No.: 15/978,387

(22) Filed: May 14, 2018

(65) Prior Publication Data

US 2019/0348984 A1 Nov. 14, 2019

(51) Int. Cl.
*H03K 17/96* (2006.01)
*G07C 9/00* (2020.01)
*B60R 25/01* (2013.01)

(52) U.S. Cl.
CPC ........... *H03K 17/962* (2013.01); *B60R 25/01* (2013.01); *G07C 9/00571* (2013.01); *G07C 9/00896* (2013.01); *H03K 2217/960785* (2013.01)

(58) Field of Classification Search
CPC ..... H03K 17/962; H03K 2217/960785; H03K 2217/96078; H03K 2217/96079; H03K 2017/9634; H03K 17/9629; H03K 17/9622; H03K 17/9643; H03K 17/9647; H03K 17/969; H03K 17/9618; H03K 2217/960795; H03K 2217/965; H03K 2217/9655; H03K 2217/9656; G07C 9/00571; G07C 9/00896; G07C 9/00309; G07C 2009/00769; G07C 2009/00619; G07C 2009/00865; G07C 2009/00841; B60R 25/01; B60R 16/02; B60Q 1/0029
USPC .......................................................... 701/36
See application file for complete search history.

(56) References Cited

U.S. PATENT DOCUMENTS

| 5,334,989 A * | 8/1994 | Nagayama | ........... H01Q 1/1271 343/704 |
| 5,416,491 A * | 5/1995 | Nishikawa | ........... H01Q 1/1271 343/704 |
| 2004/0056802 A1* | 3/2004 | Hollister | .................. H01Q 1/44 343/700 MS |
| 2004/0201526 A1* | 10/2004 | Knowles | .............. H01Q 15/002 343/700 MS |
| 2009/0140938 A1* | 6/2009 | Ishibashi | .................. H01Q 1/38 343/713 |

(Continued)

FOREIGN PATENT DOCUMENTS

JP 2006174050 A * 12/2004 ............. H01Q 13/10

OTHER PUBLICATIONS

JP2006174050A—translate (Year: 2004).*

*Primary Examiner* — Khoi H Tran
*Assistant Examiner* — B M M Hannan
(74) *Attorney, Agent, or Firm* — Lorenz & Kopf LLP (57) ABSTRACT

The present application generally relates to antennas embedded in or on glass structures. More specifically, the application teaches a wideband conformal antenna employing thin film constructions facilitating attachment to external automotive surfaces with capacitive feedback and integrated lighting to enable a conformal activation switch.

17 Claims, 6 Drawing Sheets

(56) References Cited

U.S. PATENT DOCUMENTS

| | | | |
|---|---|---|---|
| 2012/0154229 A1* | 6/2012 | Kagaya | H01Q 13/10 |
| | | | 343/713 |
| 2014/0330486 A1* | 11/2014 | Gehin | B60R 25/01 |
| | | | 701/49 |
| 2015/0277384 A1* | 10/2015 | Mankowski | G04G 17/06 |
| | | | 368/10 |
| 2017/0166169 A1* | 6/2017 | Muller | B60R 25/24 |
| 2017/0210342 A1* | 7/2017 | De Wind | B60Q 1/323 |
| 2019/0066422 A1* | 2/2019 | Breer | G07C 9/00309 |
| 2019/0069788 A1* | 3/2019 | Coleman | A61B 5/0448 |

* cited by examiner

THIN FILM DOOR SWITCH WITH INTEGRATED LIGHTING

BACKGROUND

The present application generally relates to wideband conformal antennas. More specifically, the application teaches a wideband conformal antenna employing thin film constructions facilitating attachment to external automotive surfaces with capacitive feedback and integrated lighting to enable a conformal activation switch.

Background Information

Vehicle weight reduction and improved aesthetics are important design considerations in vehicle design. Decreasing vehicle weight by reducing the mass of the vehicle is desirable to increase fuel efficiency. One limitation in reducing the volume of the vehicle or is the size of vehicle components required to be housed in the vehicle, body panels or doors. It would be desirable to reduce the volume required to house vehicle components while increasing desirable aesthetics.

SUMMARY

Embodiments according to the present disclosure provide a number of advantages. For example, embodiments according to the present disclosure may facilitate thin switch technology employing planar antenna structures and vehicular applications thereof.

In accordance with an aspect of the present invention, a thin film detector comprising a planar antenna having a thin wire grid and an illuminating portion, and a controller coupled to the thin wire grid and the illuminating portion, wherein the controller is operative to illuminate the illuminating portion when the thin wire grid is activated, the controller being further operative to detect an activation from the thin wire grid and to generate a control signal in response to the activation for coupling to a vehicle control device.

In accordance with another aspect of the present invention, a thin film detection system comprising a thin wire grid, a light pipe arranged around an outer edge of the thin wire grid, and a controller coupled to the thin wire grid and the light pipe, wherein the controller is operative to generate an illuminate signal to illuminate the light pipe, to detect a change in capacitance within the thin wire grid, and to generate a control signal in response to the detection of the change in capacitance.

In accordance with another aspect of the present invention, a method comprising receiving a first authentication signal from an authentication server wireless network, receiving a second authentication signal from a mobile device via a near field communications system, applying a current to a capacitive sensor, illuminating a light pipe indicating a location of the capacitive sensor, and generating a control signal in response to a change in current detected from the capacitive sensor.

The above advantage and other advantages and features of the present disclosure will be apparent from the following detailed description of the preferred embodiments when taken in connection with the accompanying drawings.

BRIEF DESCRIPTION OF THE DRAWINGS

The above-mentioned and other features and advantages of this invention, and the manner of attaining them, will become more apparent and the invention will be better understood by reference to the following description of embodiments of the invention taken in conjunction with the accompanying drawings, wherein.

The exemplifications set out herein illustrate preferred embodiments of the invention, and such exemplifications are not to be construed as limiting the scope of the invention in any manner.

DETAILED DESCRIPTION

The following detailed description is merely exemplary in nature and is not intended to limit the disclosure or the application and uses thereof. Furthermore, there is no intention to be bound by any theory presented in the preceding background or the following detailed description. For example, the circuitry, transmission lines and antennas of the present invention has particular application for use on a vehicle. However, as will be appreciated by those skilled in the art, the invention may have other applications.

Figure 1:
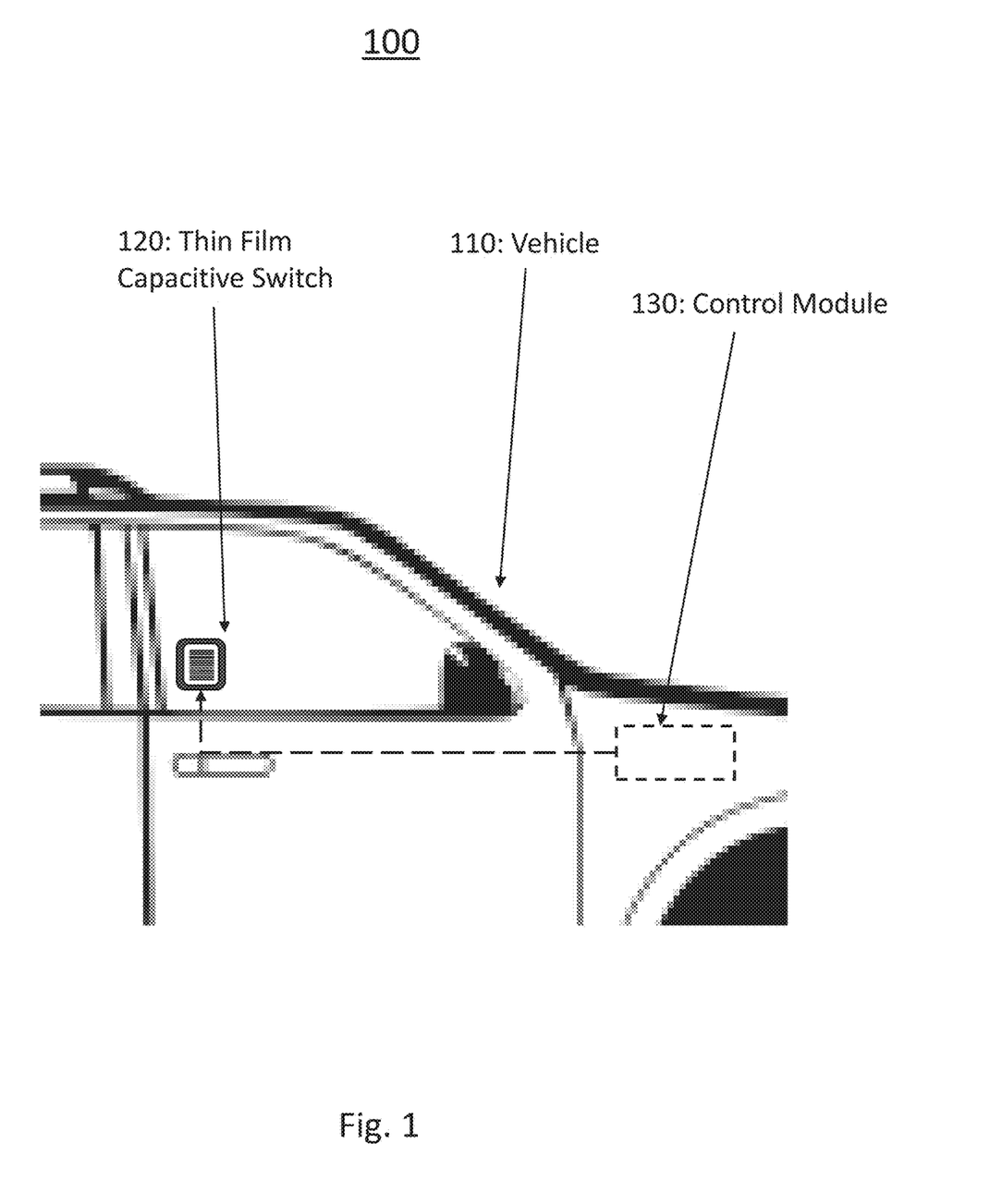
FIG. 1 illustrates an exemplary application of the vehicle integrated antenna with enhanced bandwidth in an automotive environment according to an embodiment.

FIG. 1 illustrates an exemplary application of the vehicle integrated antenna with enhanced bandwidth in an automotive environment 100. The exemplary application shows a vehicle 110 with window, an exemplary thin film capacitive switch 120 mounted to the window. The system also has a control module 130 mounted within the vehicle and not in view of a user of the vehicle.

Figure 2:
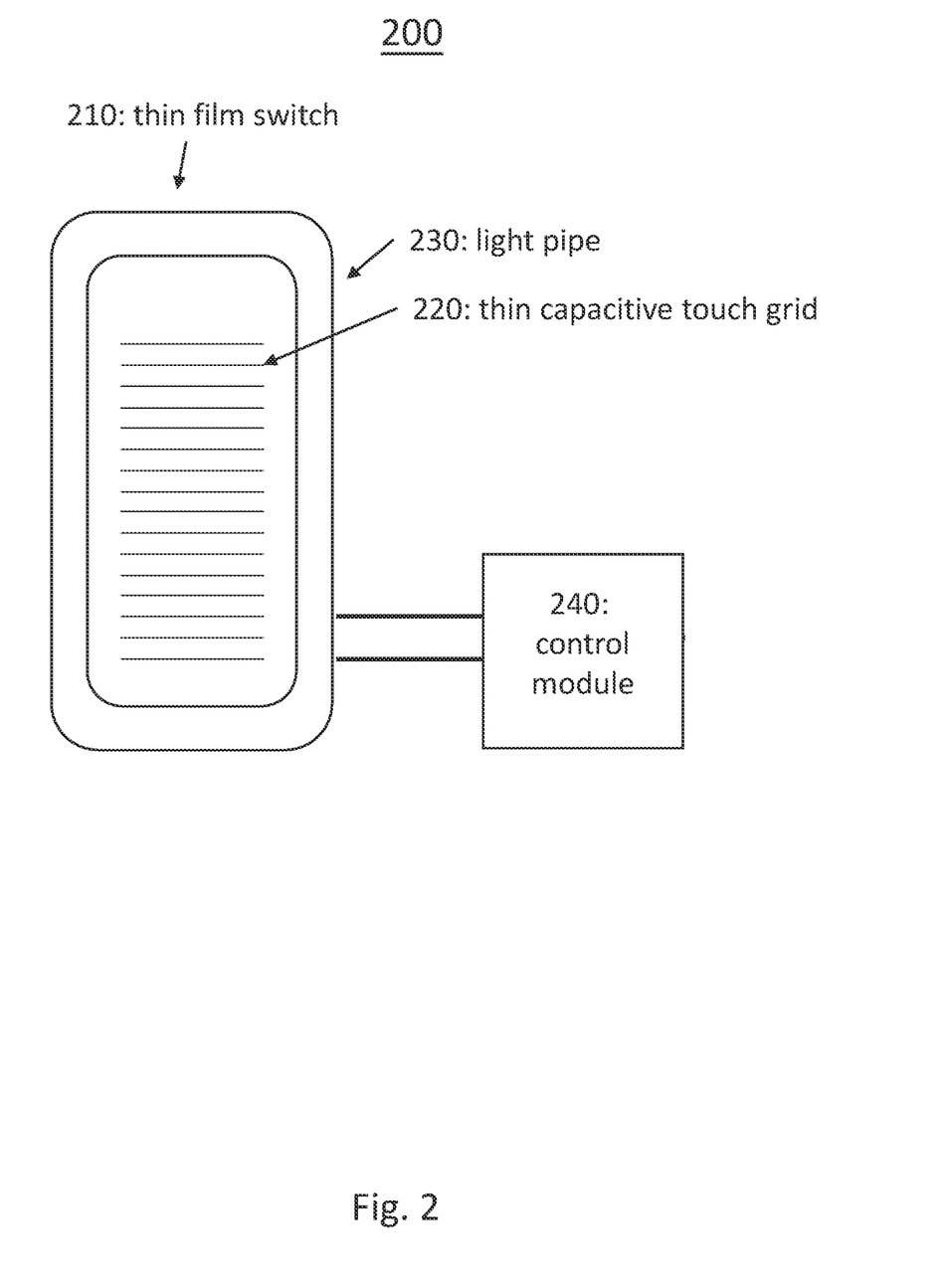
FIG. 2 illustrates an exemplary thin film door switch with integrated lighting according to an embodiment.

Turning now to FIG. 2 an exemplary thin film door switch with integrated lighting 200 according to the present disclosure is shown. In this exemplary embodiment, a thin film switch 210 is employed, for example, on an external vehicle surface, such as a window and is used to to access a door mechanism. The thin film switch 210 has an inner thin capacitive touch grid 220 and an outer thin light pipe 230. The thin film switch 210 is coupled to a control module 240 by power wires to power the outer thin light pipe 230 or a coupling light pipe which is illuminated by the control module 240. In addition, the thin capacitive touch grid 220 is coupled to the control module 240 by a capacitive touch wires, or power wires powering an integrated capacitive sensor. The control module 240 is coupled to a vehicle control system (not shown) by power and communications lines.

The thin capacitive touch grid 220 has low amperage currents running through the various lines. These low amperage currents may be generated to an oscillator to result in an AC signal. The control module 240 or integrated capacitive sensor detects changes in the electrical currents, the frequency or amplitude of the AC signal. Typically, wires on the thin capacitive touch grid are isolated from each other by an insulating medium. However, these wires will have some capacitance between them at a point where they cross. When a conductive surface, such as a hand, is brought close to this point, the capacitance will change the frequency or amplitude of the electrical currents will change, indicating to the control module 240 that a conductive body, such as a hand, has been applied to the thin capacitive touch grid 220. The control module 240 may then generate a control signal in response to the change in capacitance to couple to the vehicle control system in order to perform an action, such as actuate a motor or a switch used to open a door of the vehicle for example.

The thin light pipe 230 is used to indicate the location of the thin film switch 210 to a user. When the thin capacitive touch grid 220 is activated by application of the low amperage currents, the thin light pipe 230 may be lit to indicate that the switch is operative, may be lit to indicate the location of the switch on an unfamiliar vehicle, such as a ride share vehicle, or may be lit to indicate that the thin capacitive touch pad is activated. In a ride sharing application, the thin light pipe 230 may be activated in response to a customer cell phone being detected proximate to the vehicle. In addition, the thin light pipe 230 and the capacitive touch grid 220 may be active when a key fob or the like is determined to be proximate to the vehicle.

The control module 240 is used to control the thin light pipe 230 and the thin capacitive touch grid 220. The control module 240 receives power and controls communication from vehicle network and a vehicle control system processor. The control module 240 communicates switch status to the vehicle network. The control module 240 is further operative to send power to, and monitors, the thin film switch 210 status. The control module 240 may be operative to provides RGB light to the switch assembly through light pipe as well as controlling on/off, color, and intensity of the thin light pipe 230. Different colors may be illuminated to indicate different statuses of the thin film door switch 210, the vehicle status, or security status of the vehicle. For example, if the user does not have the appropriate authentication to enter a vehicle, such as mobile phone app or key fob, the thin light pipe 230 may be illuminated in a red color. If the vehicle door is jammed or mechanically unable to open, the thin light pipe 230 may be illuminated in a yellow color. If the door is about to open mechanically, the thin light pipe 230 may be illuminated in a green color indicating that the door is about to open.

Figure 3:
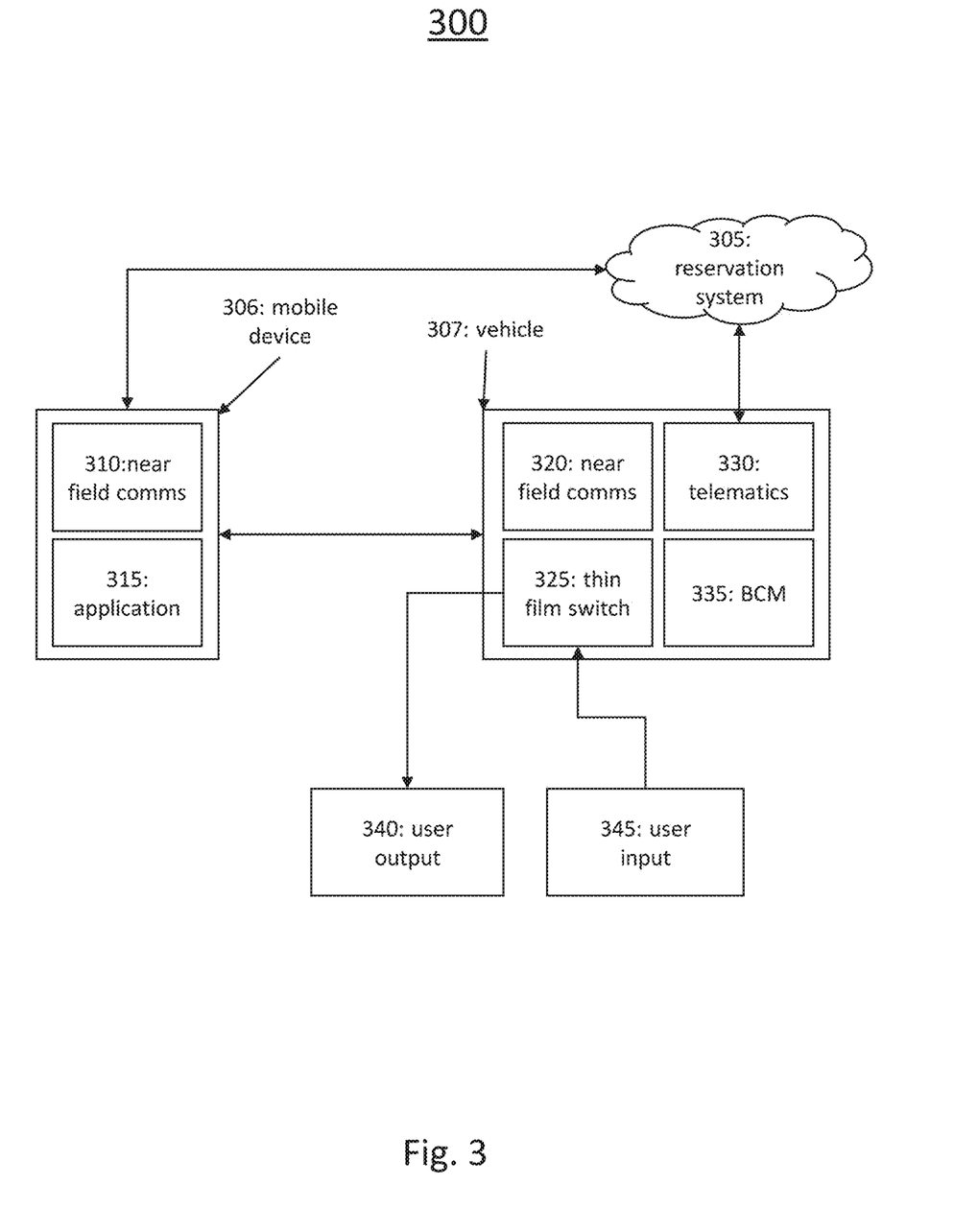
FIG. 3 illustrates a block diagram of an exemplary thin film door switch user experience according to an embodiment.

Turning now to FIG. 3, a block diagram of an exemplary thin film door switch user experience 300 is shown. The thin film door switch may be implemented with near transparency by using a pattern of thin wires to realize a capacitive grid. The thin film door switch may be enabled with input and output capabilities. By simply touching the surface of the transparent switch, passive key authentication can be initiated, similar to pressing the physical door handle button, and other types of input functions can be provided. The transparent switch may also be used as a display device to support different types of interaction with customers. These features enhance design and user experience of shared autonomous vehicles and enable rich user experience via a transparent door switch that conforms to vehicle styling with a wide variety of input capabilities and various types of external human machine interface opportunities.

The overall system includes interaction between a cloud based reservation system 305, a mobile device 306 and the vehicle 307. The vehicle 307 is equipped with the thin film capacitive switch 325 which receives user inputs 345 and generates outputs 340, such as visual indications or haptic feedback. The thin film capacitive switch 325 communicates with a body control module 335, within the vehicle 307 and a near field communications module 320 for sending information to the mobile device 306. The vehicle receives information, such as reservation information and security information, from the cloud based reservation system using a telematics module 330 via a wireless network or the like. The mobile devices equipped with an application 315 for generating control signals to communicate with the cloud based reservation system 305 and the vehicle 307 using a near field communications module 310 to transmit information such as credentials and reservation information.

In an exemplary process, a user is recognized by an approach detection system within the vehicle and the application on the mobile device. The user accesses vehicle by tapping, pressing or swiping in the touch area of the thin film capacitive switch 325. The touch area of the thin film capacitive switch may also support addition types of input operations such as Single/double tap to lock/unlock or inquire about vehicle availability or status, press and hold to close doors, hold doors, unlock all, thumbprint scanning in order to enable biometric authentication, swipes and gestures to enable features such as door open request: left/right/both, browse available functions. The thin film capacitive switch 325 may further be enabled with a virtual keypad to enter access code to enter vehicle or access contents, wherein the virtual keypad is illuminated via a light pipe configuration or the like.

The thin film capacitive switch 325 may employ connectivity with additional devices such as BLE/NFC equipped mobile devices or items equipped with NFC/RFID tags. Thus, the switch access may be enabled only when in proximity to these authorized devices. The thin film capacitive switch 325 may further be enabled only under certain conditions, such as when customer is a registered user or current reservation holder, when the vehicle is stopped/parked at a station location, or when the vehicle is available and in service. For example, the vehicle may not be designed to operate in poor weather conditions.

The thin film capacitive switch 325 can include various types of display capabilities, such as backlighting to illuminate switch area or surround lighting such as a light pipe around switch to indicate operation. The thin film capacitive switch 325 lighting capabilities may enable simple indications such as segmented LED that can be used to display numbers or letters, or silkscreen printing to indicate the location of a function: lock/unlock, open/close, etc. A full graphics display having pixel display that enables high resolution graphics for menus or logos may also be enabled.

Exemplary use cases for the thin film capacitive switch 325 may include, communicate authentication and welcome status, such as recognized: green/red, welcome message, shared vehicle availability and pricing for example green for available for use or red for: reserved, and shared vehicle charge/fuel level using a color indicator, bar graph, numeric percentage or the like.

The thin film capacitive switch 325 with light capabilities, when used on shared vehicles for example, may be used to indicate route number/color/arrival time, such as operates along blue route or time to next stop. The light capabilities may be used to indicate a fault such as doors blocked, door or vehicle system failure, communication of access code, for example wherein a remote operator with camera view provides access code, indicating response to a hail when the vehicle has recognized pickup request. The system may be further operative to indicate departure status based on a schedule or passenger manifest, or indicates ingress instructions such as "please enter other side."

Figure 4:
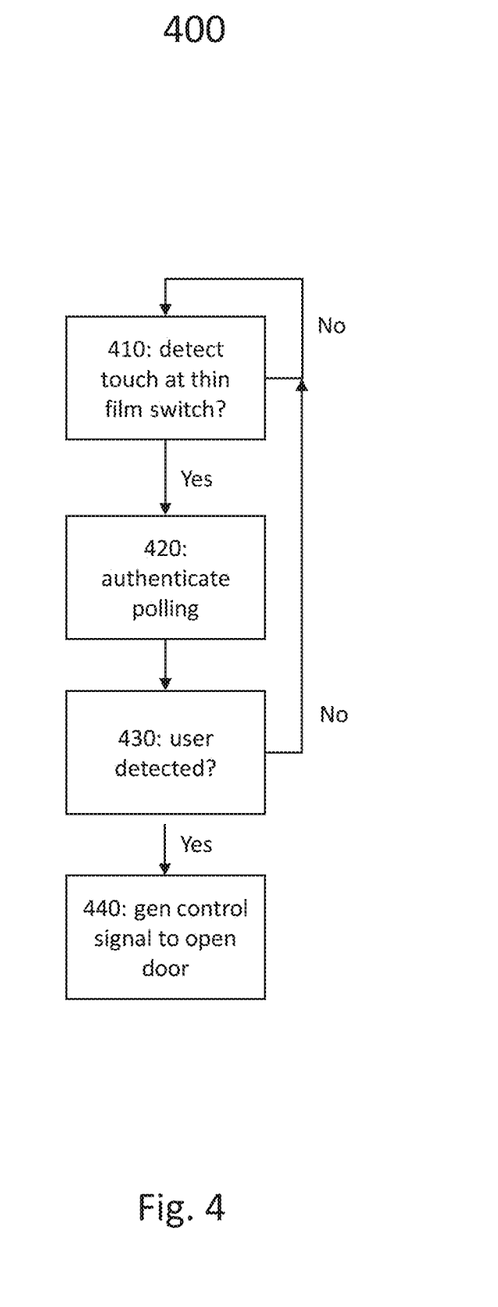
FIG. 4 shows a flowchart illustrating an exemplary method of implementation of the thin film capacitive switch with no false alarm protection.

Turning now to FIG. 4, a flowchart illustrating an exemplary method of implementation of the thin film capacitive switch with no false alarm protection 400 is shown. The thin film capacitive switch is a transparent door switch that enables a sleek access mechanism for vehicles. However, the transparent door switch could be sensitive to false positive activations from, for example, a wet leaf blows onto glass surface near the touch sensor or a person leans on the vehicle, or an accumulation of snow. It would be desirable to protect the vehicle battery from successive false positive touch sensor readings.

The method is first operative to monitor and detect a touch to the thin film capacitive switch 410. If a touch is not detected, the method returns to monitoring the thin film capacitive switch 410. If a touch is detected, the method then starts authentication polling 420 to determine if an authorized user is detected 430. If no authorized user is detected, the method returns to monitoring the thin film capacitive switch 410. If an authorized user is detected, the method is then operative to generate a control signal to open the door or grant access to the door 440.

Figure 5:
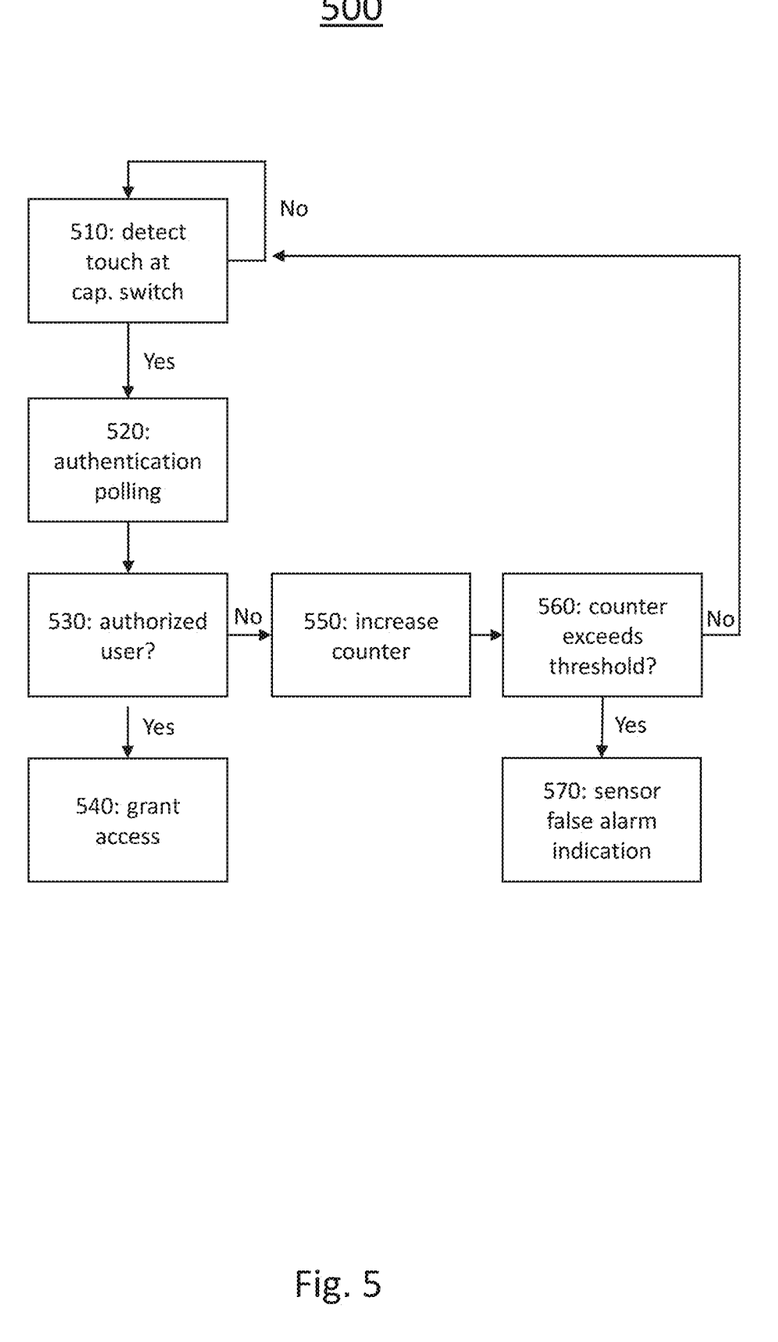
FIG. 5 shows a flowchart illustrating an exemplary method of implementation of the thin film capacitive switch with a counter limitation.

Turning now to FIG. 5, a flowchart illustrating an exemplary method of implementation of the thin film capacitive switch with a counter limitation 500 is shown. The method is first operative to monitor and detect a touch to the thin film capacitive switch 510. If a touch is not detected, the method returns to monitoring the thin film capacitive switch 510. If a touch is detected, the method then starts authentication polling 520 to determine if an authorized user is detected 530. If an authorized user is detected, the method is then operative to generate a control signal to open the door or grant access to the door 540. If no authorized user is detected, the method is operative to increase a polling attempt counter 550. The method is then operative to determine if the polling counter exceeds a threshold 560. If the threshold is not exceeded, the method returns to monitoring the thin film capacitive switch 510. If the threshold is exceeded, the method returns a touch sensor false alarm indication 570 where after appropriate action is taken by the system, such as sending an error notification to a future user, owner, or maintenance facility.

Figure 6:
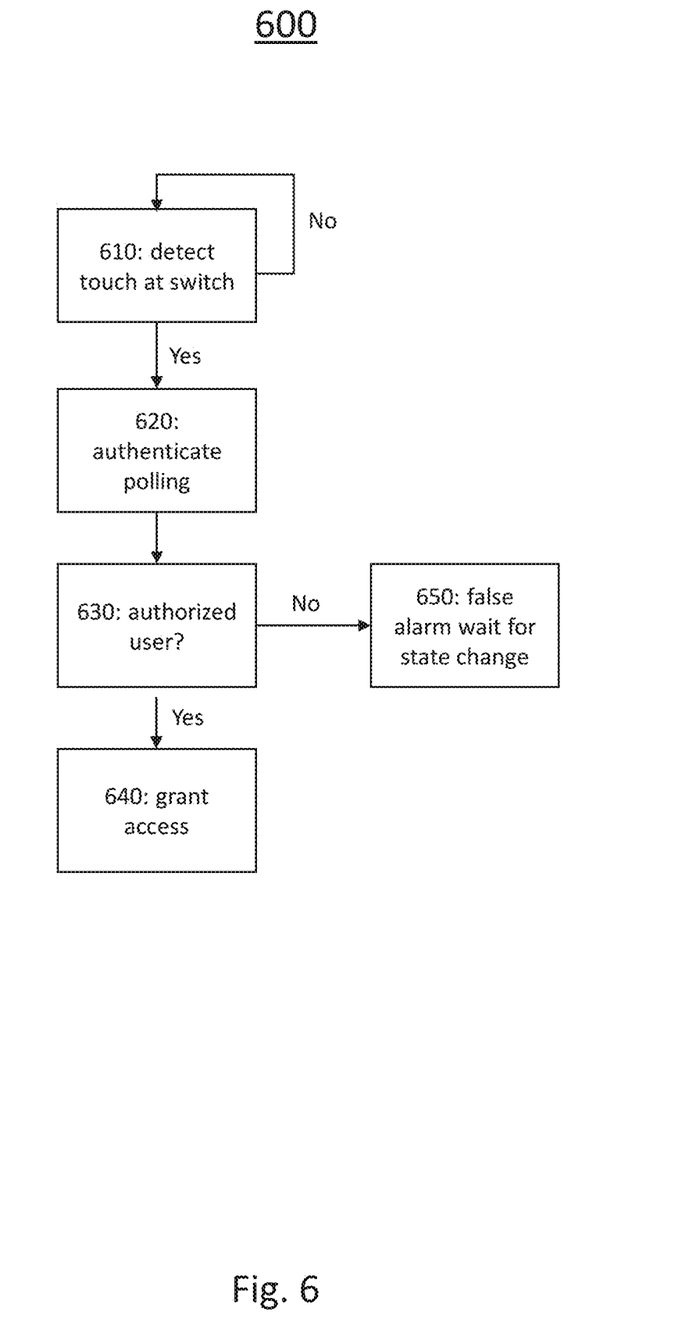
FIG. 6 shows a flowchart illustrating an exemplary method of implementation of the thin film capacitive switch with sensor state awareness.

Turning now to FIG. 6, a flowchart illustrating an exemplary method of implementation of the thin film capacitive switch with sensor state awareness 600 is shown. The method is first operative to monitor and detect a touch to the thin film capacitive switch 610. If a touch is not detected, the method returns to monitoring the thin film capacitive switch 610. If a touch is detected, the method then starts authentication polling 620 to determine if an authorized user is detected 630. If an authorized user is detected, the method is then operative to generate a control signal to open the door or grant access to the door 640. If no authorized user is detected, the method is operative to stop authentication polling, generate an indication of a false alarm on the thin capacitive touch sensor, and then wait for a state change 650. Once the state change is detected, the method is operative to return to monitoring the thin film capacitive switch 610.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the disclosure in any way. Rather, the foregoing detailed description will provide those skilled in the art with a convenient road map for implementing the exemplary embodiment or exemplary embodiments. It should be understood that various changes can be made in the function and arrangement of elements without departing from the scope of the disclosure as set forth in the appended claims and the legal equivalents thereof.

What is claimed is:

1. A thin film detector comprising:
    a thin film switch having a thin wire grid and a light pipe arranged around an outer edge of the thin wire grid; and
    a controller coupled to the thin wire grid and the light pipe, wherein the controller is operative to illuminate the light pipe in response to the thin wire grid being activated, the controller being further operative to detect an activation from the thin wire grid and to generate a control signal in response to the activation for coupling to a vehicle control device.

2. The thin film detector of claim 1, wherein the thin wire grid is a capacitive sensing device.

3. The thin film detector of claim 1, wherein the thin wire grid forms part of a near field communications device.

4. The thin film detector of claim 1, wherein the controller is operative to illuminate the light pipe and activate the thin wire grid in response to a control signal from the vehicle control device.

5. The thin film detector of claim 1, wherein the thin film detector is mounted on a glass surface of a vehicle.

6. The thin film detector of claim 1, wherein the controller is operative to receive an authentication signal from a user device and illuminate the light pipe in response to the authentication signal.

7. The thin film detector of claim 1, wherein a vehicle door is unlocked in response to the control signal.

8. The thin film detector of claim 1, wherein a vehicle door is opened in response to the control signal.

9. A thin film detection system comprising:
    a thin wire grid;
    a light pipe arranged around an outer edge of the thin wire grid; and
    a controller coupled to the thin wire grid and the light pipe, wherein the controller is operative to detect an activation of the thin wire grid, to illuminate the light pipe in response to the thin wire grid being activated, and to generate a control signal in response to the thin wire grid being activated, wherein the control signal is coupled to a vehicle control device.

10. The thin film detection system of claim 9, wherein a vehicle door is opened in response to the control signal.

11. The thin film detection system of claim 9, wherein a vehicle door is unlocked in response to the control signal.

12. The thin film detection system of claim 9, wherein the thin wire grid is a near field communications device.

13. The thin film detection system of claim 9, wherein the activation of the thin wire grid is generated in response to a communications signal generated by a mobile device.

14. The thin film detection system of claim 9, wherein the activation of the thin wire grid is generated in response to an authentication signal from a mobile device.

15. The thin film detection system of claim 9, wherein the activation of the thin wire grid is generated in response to an authentication signal from a wireless network.

16. The thin film detection system of claim 9, wherein the thin wire grid is approximately 122 mm by 500 mm.

17. The thin film detection system of claim 9, wherein the activation of the thin wire grid is generated in response to a detection of a proximate mobile device.

\* \* \* \* \*